United States Patent [19]

Bowen et al.

[11] Patent Number: 4,579,750
[45] Date of Patent: Apr. 1, 1986

[54] LASER HEATED CVD PROCESS

[75] Inventors: Harvey K. Bowen, Belmont; John S. Haggerty, Lincoln, both of Mass.

[73] Assignee: Massachusetts Institute of Technology, Cambridge, Mass.

[21] Appl. No.: 666,340

[22] Filed: Oct. 30, 1984

Related U.S. Application Data

[63] Continuation of Ser. No. 166,317, Jul. 7, 1980, abandoned.

[51] Int. Cl.⁴ .............................................. B05D 3/06
[52] U.S. Cl. .............................. 427/53.1; 204/157.61; 118/50.1
[58] Field of Search .............. 427/53.1; 204/DIG. 11, 204/157.1; 118/50.1, 730

[56] References Cited

U.S. PATENT DOCUMENTS

| | | | |
|---|---|---|---|
| 3,957,474 | 5/1976 | Kobayashi et al. | 427/53.1 |
| 4,260,649 | 4/1981 | Denison et al. | 427/53.1 |
| 4,281,030 | 7/1981 | Silfvast | 427/53.1 |
| 4,340,617 | 7/1982 | Deutsch et al. | 427/53.1 |

Primary Examiner—John H. Newsome
Attorney, Agent, or Firm—Hamilton, Brook, Smith & Reynolds

[57] ABSTRACT

A laser powered chemical vapor deposition process and apparatus for producing heterogeneous nucleation and sustained growth of films on substrates. The process is conducted at low laser intensities and high reactant pressures so as to operate in the thermal domain. Semiconductor films and fabrication of fiber optic waveguides are illustrated in the process.

19 Claims, 8 Drawing Figures

LASER HEATED CVD PROCESS

This application is a continuation of application Ser. No. 166,317, filed July 7, 1980, now abandoned.

DESCRIPTION

1. Technical Field

This invention is generally related to chemical vapor deposition (CVD). More specifically, the present invention concerns a chemical vapor deposition apparatus process in which the gaseous reactants are heated by high intensity electromagnetic radiation.

2. Description of the Prior Art

Chemical vapor deposition (abbreviated in the following as CVD) is a method of plating solid objects in which deposits are produced by chemical reactions near, at, or on the surface of a substrate. The method involves the introduction of one or more gaseous reactants into the vicinity of a substrate where the substance to be deposited is produced by a change in chemical state such as a breakdown or a combination of reactants. CVD has found a variety of commercial applications; examples are the metallization of mirrors, the pigmentation, reinforcing, protection and decoration of surfaces, and the manufacture of semiconductor devices in integrated circuitry. CVD can be used to deposit elemental substances as well as chemical compounds such as bromides, carbides, nitrides, oxides and silicides. Deposited films may be amorphous, polycrystalline or epitaxial and may be electrically insulating, semiconducting or conducting. A survey of fundamentals, techniques and applications of CVD is given in C. F. Powell et al., *Vapor Deposition*, John Wiley & Sons, Inc., 1966.

As a typical example, dielectric films of silicon dioxide are widely used in the fabrication of planar microelectronics, particularly in MOS technology for selective masking, electric field isolation, and gate insulation. Silicon dioxide films have been fabricated using the chemical vapor deposition process by a process which involves the thermal decomposition of silane into free silicon for oxidation by free oxygen gas mixed with silane.

In a typical process for the deposition of silicon dioxide by CVD, the reactive gases are a mixture of 0.003% to 0.8% silane and 0.01% to 10% oxygen in a non-reactive carrier gas such as nitrogen which makes up the balance of the processing gas. This gas mixture is introduced into a reactor containing a substrate upon which the silicon dioxide is to be deposited. The substrate is heated to cause the reaction. When the heated silane disassociates, silicon atoms which are released from the hydrogen bonds, are in a very active state in which they seek to re-establish other bonds. Since there is free oxygen present, the silicon atoms combine with the oxygen atoms to form silicon dioxide molecules at or near the surface of the substrate. Unsatisfied oxygen atom bonds attach to atoms already on the surface of the substrate to produce a stable structure. Deposited atoms form a base upon which other silicon dioxide molecules can deposit so that a fine grain structure is built up. However, if gaseous silicon dioxide molecules come into contact with other silicon dioxide molecules in the gas before reaching the surface of the substrate, the molecules in the gas join up if their concentration is greater than the equilibrium concentration. As more are encountered, the molecules continue to attach and grow to form stable particles. Such particles land on the surface like snow and form a coarse, porous and granular structure. This coarse, porous and granular structure is usually unacceptable and produces undesirable results in a deposited film. The foregoing deficiency is caused by premature gas phase reaction. Ideally each disassociated silicon dioxide molecule should deposit on the substrate rather than attach to each other before falling onto the substrate. The latter process whereby the molecules combine in the gas phase is called homogeneous nucleation and it is an object of the present invention to avoid or minimize such growth. Rather, in the apparatus of the present invention, apparatus is provided which induces controlled heterogeneous nucleation on the substrate. Another disadvantage of the prior art CVD process lies in the fact that the normal process for heating the substrate employs some form of indirect infrared heating elements such as are shown in U.S. Pat. Nos. 4,033,286 and 3,916,822. These heating elements heat up the substrate but in the process unavoidably heat up other parts of the reactor chamber thereby introducing contaminants in the form of gases given off from the heating process which cause defects in the deposited film.

There is a need in the semiconductor industry for a very insulating substrate such as sapphire on which silicon is deposited. One of the problems associated with the present process is that the silicon substrate first must be hot enough to drive the reaction to put down the film. Then the film and the substrate is cooled down and since they have different thermal expansions dislocations occur at the interface. Dislocations result in poor properties so to avoid this, ion bombardment is used to make the film amorphous and then recrystallize it.

In the present invention since it is not necessary to heat the substrate, the above problems are avoided or minimized.

Invention Disclosure

In accordance with this invention, gaseous reactants that can be converted to a vapor state and deposited on a substrate are exposed to laser light to excite the molecules of at least one of the reactants to effect a desired thermal reaction. The laser beam is directed to a position which is in close proximity to the substrate. The closeness of the reaction zone to the substrate facilitates controlling homogeneous gas phase nucleation which must be suppressed and is conducive to heterogeneous nucleation which sustains the growth of films. The proximity of the reaction zone to the substrate combined with the steep temperature gradient surrounding the laser heated hot zone maximizes control over the chemical reaction and the deposition rates both of which are essential for producing uniform films.

Homogeneous gas phase nucleation is suppressed (1) by a small chemical driving force (supersaturation or excess vapor pressure of the reaction product atoms or molecules relative to the equilibrium vapor pressure of the condensed product); or (2) by reducing the kinetics by decreasing the molecular collisions between reaction product molecules (atoms). Nucleation of small particles from a vapor is inhibited due to a nucleation barrier,i.e. the free energy increase of the collection of molecules (atoms) when a new surface is created. The effect of this barrier is diminished as the system is driven further from equilibrium (larger supersaturation) until a critical supersaturation is reached at which time many nuclei form and grow into undesirable condensed phase particles.

For a gaseous molecule such as SiH$_4$ (silane), which is thermodynamically unstable relative to solid silicon and hydrogen gas, the rate of decomposition is dependent also on the availability of energy to break the Si-H bond. This energy can be provided by normal thermal heating, by light, etc. If enough energy is provided by a single photo (about 1 eV) a hydrogen atom can be removed. Lower energy light such as highly absorbing photons from a CO$_2$ laser (about 0.1 eV) can be absorbed in multiples by a molecule. If the absorbing molecules collide, energy is transferred between molecules which results in a distribution of energy in a collection of molecules which depends on the temperature and pressure of the gas (i.e., the number of collisions per unit time), the energy density of the light and the energy and absorption of the photons. This relatively low energy (about 0.1 eV) and low intensity radiation can be used to rapidly energize reacting molecules.

To enhance heterogeneous nucleation (deposition of the reaction product onto a substrate), the supersaturation of the product, e.g., Si gas, must not be great enough to overcome the homogeneous nucleation barrier. If the interface energy between the substrate and the product is lower than the surface energy for homogeneous nucleation, then desirable heterogeneous nucleation will occur first. This is facilitated by reducing the collisions between the gaseous reaction product molecules and increasing the probability of collisions with the substrate. This can be accomplished with lower pressures and by focusing the light in the region near the surface. If the localized absorption, and decomposition reaction occur within a few mean free path lengths of the gaseous molecules, then the probability of nucleating particles in the gas phase is decreased.

Thus there is a window of conditions for depositing films onto substrates: reacting gas pressure high enough for thermal mode of heating, yet low enough so that the reaction product gases do not nucleate particles in the gas phase. This latter condition is limited most significantly by the nucleation barrier, but also by limiting the molecular collisions.

The principle advantages of this invention which utilizes a laser energy source to transmit energy directly to a reactant gas molecule for a CVD process are:
elimination of all impurity sources,
absence of surfaces which cause heterogeneous reactions at unwanted locations,
independent control of the temperature of the gas and substrate, and thus more flexible control of the deposition reaction,
selective energy transfer to specific gas molecules by choice of the laser emission wavelength and the optically absorbing reactant gas,
highly efficient utilization of reactant gas, highly efficient utilization of emitted light,
high overall energy efficiency compared to alternate heat sources and unusually good control over gas heating rates,
unusually high heating rates,
unusually high temperature gradients between heated gas and substrate,
freedom to select ambient gas composition in terms of process or device requirements,
freedom to select ambient gas structure and
potential for very high deposition rates because of available laser power and high gas pressure.

DESCRIPTION OF THE PREFERRED EMBODIMENT

Figure 1:
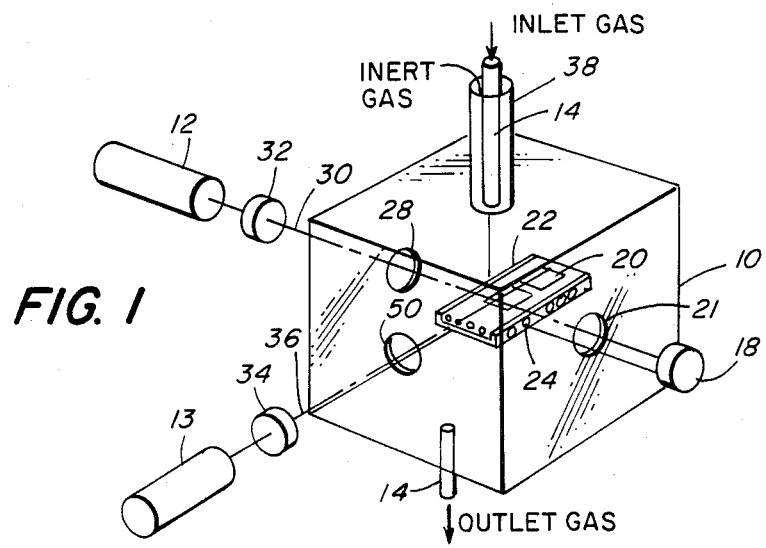
FIG. 1 is a schematic representation of an improved chemical vapor deposition reactor in accordance with the present invention.

FIG. 1 shows an enclosure 10 in which chemical vapor deposition may occur. Enclosure 10 may comprise a glass or other suitable airtight container in which is disposed one or more substrates 20 upon which it is desired to form a suitable film of material. The substrate is disposed on a conveyor belt 22 which in turn is connected with rollers 24 operated by a motor (not shown) to provide motion of the substrate with respect to the laser beam emanating from CO$_2$ laser 12. The laser beam 30 is directed into the interior of the reactor container 10 in close proximity to the substrate 20. A suitable lens 32 is provided to shape the laser beam to obtain the desired beam intensity in the reactor. A suitable window 28 is provided having appropriate properties for withstanding the intensity of the laser beam and being relatively nonabsorbent of CO$_2$ laser energy. A reactant gas stream containing one of more gaseous reactants is introduced into the reactor apparatus 10 through gas inlet 14. A coaxial conduit is supplied surrounding inlet tube 14 which enables the supply of an inert gas such as argon to be introduced at conduit 38. The envelope of inert gas which is introduced into conduit 38 provides a means for containing or confining the reactant gas to the area surrounding the substrate. It is to be understood, however, that in some instances, depending on the gas reactants, it may not be necessary to use an inert gas for confinement and it is, therefore, not essential to this invention. The reactant gas passes through laser beam 30 and is heated directly by the light emitted from the laser. This reaction zone is extremely localized and may be precisely controlled. The laser beam 30 is directed to a position which is in close proximity to the substrate 20. The closeness of this reaction zone to the substrate facilitates controlling and enhancing heterogeneous nucleation and sustained growth of films while suppressing gas phase nucleation.

Unreacted reactant gas passes through a filter not shown under the influence of a vacuum created at outlet conduit 14 and may be recycled as desired. Laser beam 32 after passing through the reacting gas exits through window 21 and impinges upon a copper heat sink 18 which may be cooled by water or other suitable means. The substrate 20 may be maintained stationary during the reactant process or may be stepped along the conveyor by step motor means (not shown) or may be continuously moved past the laser beam during the reaction process depending on the reactant time for a particular process. Also, in order to provide a precise area in which the reaction occurs a second laser 13 having suitable focusing means 34 may be provided in order to provide a second laser beam 36 which will intersect at an angle with laser beam 30 to provide a predetermined area or volume of laser energy having sufficient intensity to produce a desired reaction adjacent to substrate 20.

The energy density of the laser beams 30 and 36 may be suitably shaped by well known optics to provide either a torus volume of a cylinder or line plane of laser energy thereby enabling precise control of the space volume in which the reaction of the gas reactant with the laser beam will occur and thus control the area over which the film is deposited with great accuracy. Furthermore, since the only volume which is subjected to high temperature is the volume where the laser beam reacts with the reactant gas, the remaining portions of the reactant chamber remain at room temperature thereby avoiding contaminants which might occur at elevated temperature.

A third variable can be introduced whereby the substrate temperature can also be controlled by suitable heating means embedded in the conveyor belt 22 (not shown) so that both the temperature of the reactant gases and the temperature of the substrate can be precisely controlled. By way of example and not by limitation suitable reactant gases might be ammonia ($NH_3$) and silicon hydride ($SiH_4$) which would react to form a silicon nitride film which is extremely useful in the semiconductor industry for forming insulating layers on integrated circuits. Other reactant gases might comprise suitable silicon bearing reactants, for example $SiH_2Cl_2$, $SiCl_4$ or $SiF_4$. Suitable boron and phosphorous dopants may be also introduced with the reactants by adding $B_2H_6$, $BCl_3$ or $PH_3$ to the reactant gases at the inlet conduit 14. Hydrogen or flouride can be added to the amorphous silicon by adding an excess of hydrogen and/or hydrogen flouride to the reactants.

Instead of recycling the inlet reactant gas, the gas may be maintained stationary and controlled thickness of films can be built up utilizing a $CO_2$ pulse laser and repeatedly burning through the static reactant gas above the substrate 20. In this manner virtually all of the reactant gases can be converted and virtually all of the emitted light may be absorbed by the reactants. Thus the overall electricity to heat efficiency will be essentially that of the laser which is approximately 15% for commercial $CO_2$ lasers. This efficiency level is substantially higher than is achievable with film processes such as sputtering or RF plasma techniques. Furthermore, since there are no heated components which could contaminate the reactant gases or the film, a high degree of purity is achieved. The extremely localized heated gas zone above the substrate will permit the substrate to remain cold. Therefore, the substrate materials can be selected without placing high priority on contamination or thermal expansion effects.

The substrate may comprise a body of silicon, $SiO_2$, glass, plastic or $Al_2O_3$. The deposited layer may consist of Si, $SiO_2$ or $Si_3N_4$.

The use of a plastic substrate is believed to have been previously impractical since heretofore, with the use of conventional CVD heat sources, the reaction temperatures are too high for the plastics to survive. In the present invention it is possible to heat the reactants and drive the reaction under conditions where the plastic is maintained at a temperature where it is not degraded.

Figure 2:
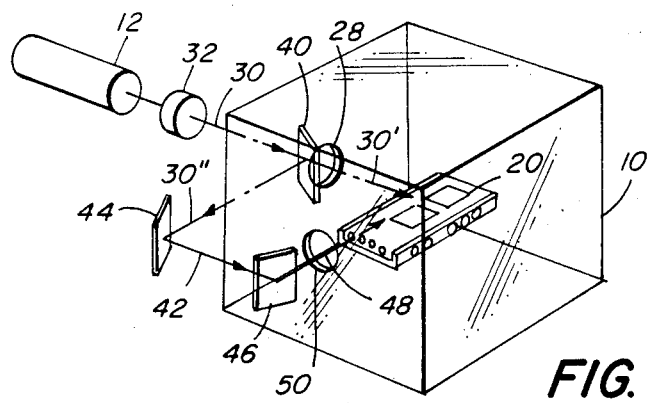
FIG. 2 is a schematic representation of an alternate embodiment of the reactor of FIG. 1.

FIG. 2 shows an alternate embodiment of the invention in FIG. 1 in which like elements contain like numeral references. As can be seen in FIG. 2 the main difference involves the use of a partially reflecting or beam splitter mirror 40 to split the laser beam 30 into two beam paths 30' and 30". Beam path 30' proceeds as depicted in FIG. 1 to pass through laser window 28 into the reaction chamber 10 immediately above substrate 20. In place of the second laser 13 in FIG. 1, a laser mirror 44 is provided in the path of laser beam 30" to laterally reflect the beam along beam path 42 to mirror 46 where the beam is again reflected along the beam path 48 through the laser window 50 where it may intersect with beam 30' over the substrate 20. Various focusing devices may be provided in the path of beam 30' and 30" to achieve a beam intensity above the substrate which is tailored for a particular reaction desired similarly to that provided in FIG. 1 wherein two laser beams were utilized. It should be noted that suitable exit windows and energy absorbers (not shown) such as elements 21 and 18 of FIG. 1 would be included in the apparatus of FIGS. 2 and 3.

Figure 3:
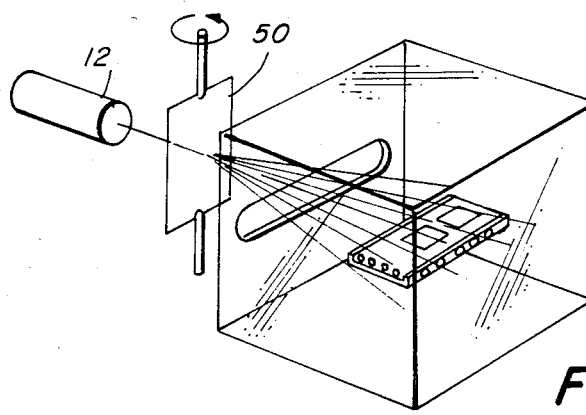
FIG. 3 is a further schematic representation of an alternate embodiment of the reactor of FIG. 1.

FIG. 3 shows a third embodiment of the invention in which like components have like numeral references. The main distinction between FIG. 3 and FIGS. 1 or 2 resides in the fact that the laser beam may be scanned above the substrate by a suitable well known laser scanning mirror 50 which is disposed in the path of the laser beam 30. Thus, in this embodiment, the substrate may be maintained in a fixed position while the laser beam is passed above the substrate to create a volume deposition on the substrate as the laser beam is scanned above the substrate and reacts with the reactant gas in the reactant chamber 10.

Figures 4, 5, 6:
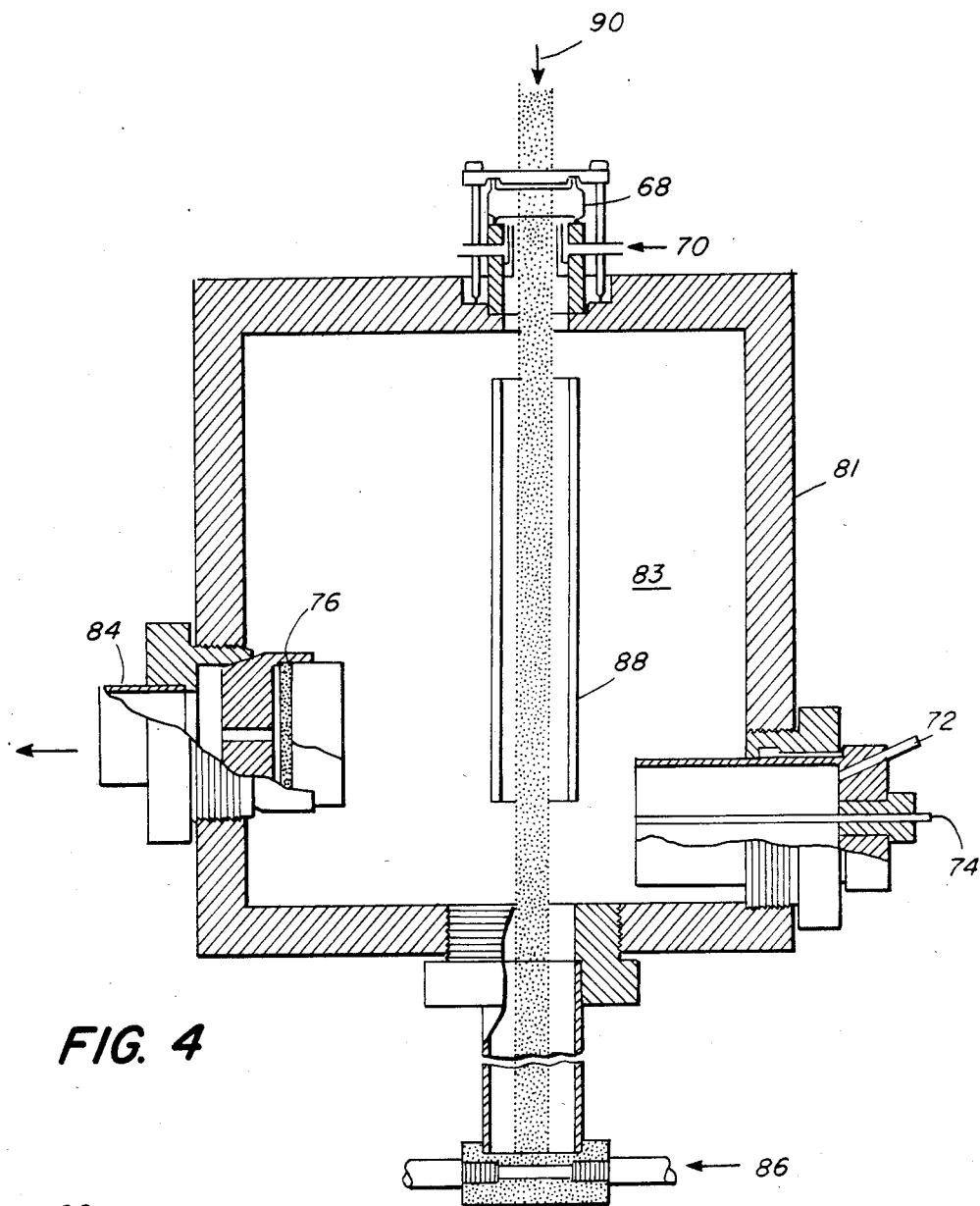
FIG. 4 is a partially schematic representation of an improved chemical vapor deposition reactor in accordance with the present invention for fabricating fiber optical waveguides.
FIG. 5 is a cross-sectional view of a fiber during one stage of the process shown in FIG. 4.
FIG. 6 is a cross-sectional view of the fiber as finally fabricated.

A further embodiment of the present invention is depicted in FIGS. 4, 5 and 6 wherein the laser CVD process of this invention is used to fabricate an optical waveguide.

The core of an optical waveguide should be produced from an optical quality glass having a higher index of refraction than the cladding while having physical characteristics similar to the cladding. Thus, it is customary to utilize the same or a similar type of glass for the core of the waveguide as is used for the cladding, but the glass in the core is doped with a small amount of some other material to slightly increase the index of refraction thereof. For example, if pure fused silica is used as the cladding glass, fused silica doped with a material to increase its index of refraction can be used as the core glass. Examples of suitable dopants are titanium oxide, tantalum oxide, tin oxide, niobium oxide, zirconium oxide, aluminum oxide, lanthium oxide, germanium oxide and boron oxide. A particularly suitable core glass is fused silica doped with titanium oxide.

It has also been found that the light propagated through an optical waveguide is substantially entirely propagated through the core with very little light being propagated through the cladding, much less the surrounding structural tubing. Thus, the fact that the outer thick wall tubing may have undesirable high impurities does not effect the light propagation through the waveguide.

Proceeding now to FIGS. 4, 5 and 6, there is shown a method and apparatus for fabricating an optical waveguide having a very pure inner core glass composition 94 surrounded by a very pure cladding glass material 92 surrounded by a support glass material 88 as shown specifically in FIG. 5. In the apparatus as shown in FIG. 4 a thick wall tube 88 is supported (by means not shown) coaxially about laser beam 90 which may be provided by a $CO_2$ laser (not shown). Since, as previously hoted, the thick wall tube 88 merely provides exterior structural support for the light propagating core or cladding material to be deposited on the structural tube, tube 88 may consist of normally produced glass having an ordinary level of impurities. It must, however, have a viscosity and coefficient of expansion compatible with the waveguide cladding and core materials. Reaction chamber 83 consists of an enclosure 81 which may be initially evacuated. An opening is provided for the introduction of reactant gases from inlet 74 into the reaction chamber and if desired, appropriate inert gases may be introduced coaxial to the reactant gas from inlet 72 as previously described in connection with FIG. 1.

A window 68 is provided through which the laser beam 90 is directed into the interior of the reaction chamber. The window 68 is held in place by means of a plate, screws, support and O-rings which are not material to this invention. If desired, accumulation of powder on the interior surface of window 68 may be prevented by passing an inert gas past the interior surface of the window 68 through gas inlet 70. The reactant gas which is introduced through gas inlet 74 passes into the interior of thick wall glass tube 88 and is impinged upon by the laser beam where, depending on the gas flow conditions and the pulse repetition rate of the $CO_2$ laser, a suitable reaction temperature is achieved such as will cause the chemical vapor deposition of the reactant gas onto the interior of glass support structure 88. The focus of the laser beam may be adjusted and the tube 88 rotated by means (not shown) to affectuate a smooth, even deposition of the desired depth and composition on the interior of support tube 88. The first coating 92 would require a reactant gas which is pure silicon dioxide without any titanium dopant. A suitable second coating 94 for the waveguide core material would consist of a titanium doped fused silica. Suitable reactant gases for depositing such a coating would consist of silicon hydride $SiH_4$ and titanium tetrachloride $TiCl_4$ and oxygen which would form a vapor deposition of silica doped with titanium.

After the first and second coatings have been applied to the thick wall outer glass structure 88 the tubing is removed from the reaction chamber and the resultant substantially cylindrical hollow assembly is heated and drawn to reduce the cross sectional area and to collapse the first and second coatings of glass to form a fiber as shown in FIG. 6 having a solid cross sectional area. The collapsed first or inner coating 94 forms the fiber core and the second coating 92 forms the cladding for the fiber.

In the apparatus of the present invention it is possible to preferentially excite some reactant molecules versus other reactant molecules in the same reaction or to excite two different molecules substantially equally.

This may be appreciated from a consideration of Table I below and FIGS. 7 and 8.

TABLE I

| 1<br>Spectral<br>Line | 2<br>Wave<br>Length<br>μm | 3 Absorption Coefficients ($atm^{-1} cm^{-1}$)<br>$NH_3$ | 4<br>$SiH_4$ |
|---|---|---|---|
| R(38) | 10.137 | .044 A | 1.68 C |
| R(36) | 10.148 | not measured | .27 C |
| R(34) | 10.159 | .0072 A | (small) C |
| R(32) | 10.171 | .0065 A | .19 C |
| R(30) | 10.182 | .047 A | .96 C |
| R(28) | 10.195 | .057 A | 2.68 C |
| R(26) | 10.207 | .059 A | .70 C |
| R(24) | 10.220 | .056 A | .31 C |
| R(22) | 10.233 | .071 A | 1.36 C |
| R(20) | 10.247 | .12 A<br>.22 B | 1.61 C |
| R(18) | 10.260 | 7.25 B | .87 C |
| R(16) | 10.275 | .24 A | 1.14 C |
| R(14) | 10.289 | .47 E<br>.50 A | .79 C |
| R(12) | 10.304 | 21.5 E | .23 C |
| R(10) | 10.319 |  | .34 C |
| R(8) | 10.333 |  | .007 C |
| P(8) | 10.476 | .35 A | 2.70 C |
| P(10) | 10.494 | .16 A | .50 C |
| P(12) | 10.513 | .65 A | 3.95 C |
| P(14) | 10.532 | .83 A | 1.94 C |
| P(16) | 10.551 | .41 A | .96 C |
| P(18) | 10.571 | .18 A | 11.8 C |
| P(20) | 10.591 | .30 A | (43.0) C<br>12.9 D |
| P(22) | 10.611 | .13 A | (28.9) C<br>8.17 D |
| P(24) | 10.632 | .16 A | (34.5) C<br>10.7 D |
| P(26) | 10.653 | .42 A | 7.42 C |
| P(28) | 10.675 | .35 A | (29.4) C<br>8.94 D |
| P(30) | 10.696 | .87 A | 6.46 C |
| P(32) | 10.719 | 13.6 E | 3.79 C |
| P(34) | 10.741 | 3.5 A | 5.01 C |
| P(36) | 10.765 | 1.8 E | 18.1 C |
| P(38) | 10.788 | 1.02 E | 1.05 C |
| P(40) | 10.812 | 1.0 A |  |

Table I is a listing of the absorption coefficients of ammonia and silane under the pressure and cell size conditions specified by the letters A, B, C, D, or E in columns 3 and 4, where:
A: 136±2 torr 10 cm cell
B: 130±2 torr 1.7 cm cell
C: 53±1 torr 1.7 cm cell
D: 11±1 torr 1.7 cm cell
E: 25±1 torr 1.7 cm cell The bracket ( ) in column 3 or 4 denotes uncertainty in the precision of results. Two different cell sizes were used in the Table I measurements, a 10 cm cell and a 1.7 cm. cell. The laser was a line tunable $CO_2$ laser.

Figure 7:
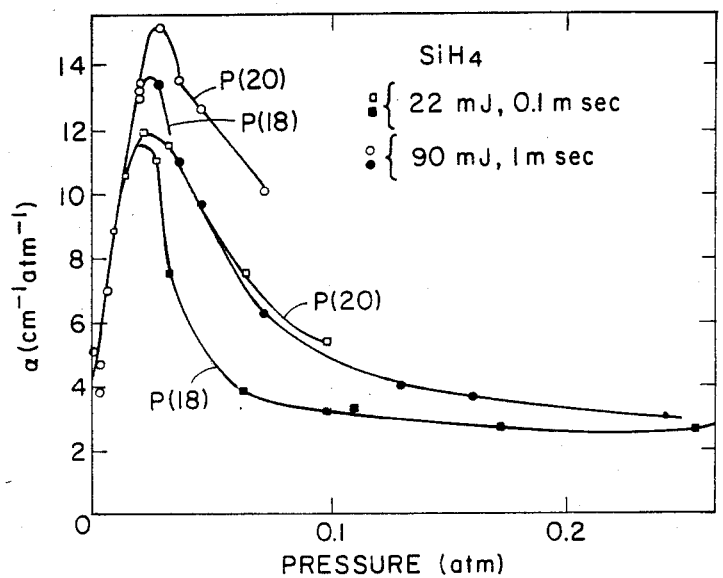
FIG. 7 is a graph showing the absorption coefficients of SiH$_4$ as a function of pressure for the P(18) and P(20) CO$_2$ laser lines.

FIG. 7 is a plot of the absorption coefficients of $SiH_4$ as a function of pressure for the P(18) and P(20) $CO_2$ laser lines. FIG. 8 is a plot of the absorption coefficients of $NH_3$ as a function of pressure for the P(18) and P(20) laser lines. The measurements in FIGS. 7 and 8 were made using an untuned Coherent Radiation Model 150 $CO_2$ Laser. The laser was pulsed at 1 hz with pulse lengths of 0.1 m sec (shown by the symbol □) and pulse lengths of 1.0 m sec (shown by the symbol o).

Figure 8:
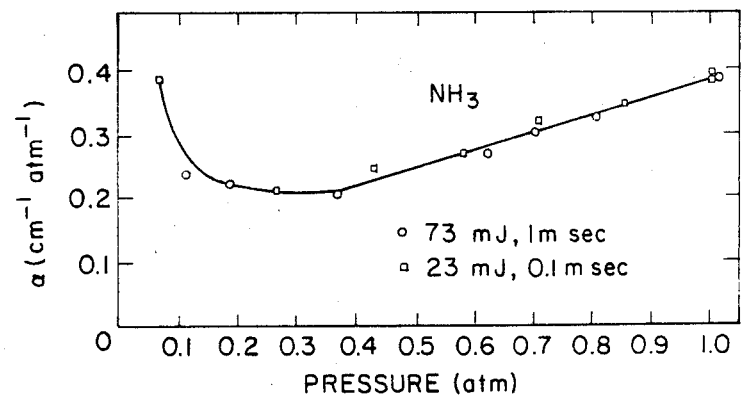
FIG. 8 is a graph as in FIG. 7 for NH$_3$.

The absorptivities measured and listed in Table I and FIGS. 7 and 8 have two important consequences. The first is that the highest absorptivity level is exhibited by $SiH_4$ for the P(20) emission from the $CO_2$ laser. Fortuitously, this P(20) emission has the highest gain and is the most efficient emission from the laser and is also the most strongly absorbed by the reactant gas $SiH_4$ which gas is a most desirable CVD reactant gas. Also, there are other emission lines where $SiH_4$ and $NH_3$ have approximately equal absorptivities (e.g., P(34) and P(38) lines) or where $NH_3$ has a higher absorptivity than $SiH_4$ (e.g., R(18) and P(32) lines). Thus it is possible, by changing the gas species which preferentially absorb the laser radiation, to influence the chemical reaction and kinetics even though the process is usually carried out in the thermal domain where a normal distribution of energies is assumed.

For example, as can be seen in FIG. 7, when operating at a pressure of about 0.01 atmospheres the P(20) emission from the $CO_2$ laser will be more strongly absorbed by $SiH_4$ than the P(18) emission; whereas $NH_3$ exhibits equal absorptivity to both lines and is about 20 to 50 times less than $SiH_4$ absorptivity. Thus, by judicious selection or changes of reactant gases it is possible, for example, to have a CVD process in which molecule A is preferentially excited and heated and molecule B is excited to a lesser degree and except for thermal reactions would be at a lower temperature.

It should also be noted that in order to operate in the thermal domain and thereby achieve control of the nucleation growth process it is important to maintain a combination of both relatively high reactant pressure, and low laser intensity. For high absorbtivity gases such as $SiH_4$ the preferred operating parameters therefore should be in the order of 0.01 atmospheres pressure and in laser intensity in the order of 1000 watts per $cm^2$ or less. This should be contrasted with a relatively high intensity low pressure system in which gas molecules are disassociated before colliding with other molecules, i.e. a unimolecular or bimolecular reaction. Such reactions occur, for example, in $SiH_4$ of $NH_3$ at intensity levels in the order of $10^{12}$ watts/$cm^2$ and gas pressures in the order of 0.01 atmospheres or lower.

While particular embodiments of the invention have been described, other modifications are within the spirit and scope of this invention. For example, the amount of dopant supplied in the reaction gas stream of FIG. 4 may be varied as the coating is formed to provide a graded index fiber optic device.

While in the embodiments shown, an infrared $CO_2$ laser is used to excite vibrational or rotational modes, it is possible to use shorter wavelength lasers, for example, in the ultraviolet to couple to electronic transmissions. The laser could be a ruby laser or a YAG laser or any of the other laser sources readily available.

Also the material to be deposited can be various materials such as silicon, silicon dioxide, or silica nitride and with the flexibility of this laser driven process they may be deposited as amorphous materials, as polycrystalline materials or as single crystalline materials depending upon the substrate materials and the temperature of the substrate material. The polycrystalline material can either be fully dense or porous depending on the deposition rate.

The substrates may be, for example, a substrate of single crystal silicon on which an amorphous or single crystalline deposit is made.

We claim:

1. The process for forming solid film(s) of reactant products on a substrate from gaseous reactant(s) which comprises:
    a. exciting said reactant(s) by exposing the reactant(s) to a relatively low energy density laser beam in a volume adjacent to the substrate without substantially heating the substrate with the laser beam to thermally dissociate the molecules or atoms of said reactant(s) and directly nucleate and continue to deposit dissociated reactant product(s) on the surface of the substrate thereby to produce a controlled heterogeneous nucleation of the reactant product while substantially preventing recombination of said reactant product thereby to suppress homogeneous nucleation of the reactant product(s) to form said solid film(s) of reactant product(s) on said substrate.

2. The process for forming film(s) on a substrate from gaseous reactant(s) in a reactant chamber having a window through which a laser beam from a laser may pass, which comprises:
    a. locating a substrate within said chamber;
    b. introducing said reactant(s) into said chamber;
    c. establishing a gas pressure within said chamber;
    d. exciting said reactant(s) by exposing said reactant(s) to said laser beam in a volume adjacent the substrate without substantially heating the substrate with the laser beam, the power density of the laser beam and the chamber pressure being maintained at a level to induce substantially thermal reactions of predetermined constituents of said reactant(s) to form heterogeneous nuclei of reactant product(s) of said predetermined constituents directly on said substrate and to suppress recombination of said predetermined reactant product(s) to prevent homogeneous nucleation of the constituents and by sustaining said deposition process thereby forming solid film reactant product(s) on said substrate.

3. The process of claim 2 or 1 in which the laser energy power density is maintained at a level in the order of 1000 watts per $cm^2$ or less.

4. The process of claim 2 or 1 in which the gaseous reactants are a mixture of ammonia and silane and the film reactant product is $Si_3N_4$.

5. The process of claim 2 in which the laser energy may be varied across a frequency spectrum to selectively dissociate a reactant gas.

6. The process of claim 2 in which the gaseous reactant is one which has its greatest absorptivity at the frequency of the laser energy which is most efficiently generated.

7. The process of claim 2 in which the gaseous reactant(s) comprise $SiH_4$ and $O_2$, the laser is a $CO_2$ laser, and the film reactant product is $SiO_2$.

8. The process of claim 1 in which the gaseous reactant(s) absorb(s) a predetermined emission frequency of laser radiation substantially equally and the frequency of the laser energy is maintained at said predetermined frequency.

9. The process of claim 8 in which the reactant(s) are $SiH_4$ and $NH_3$, and the predetermined frequency is the P(34) or (P38) line of a $CO_2$ laser.

10. The process of claim 1 or 2 in which the laser energy is scanned over said substrate.

11. The process of claim 1 or 2 in which the substrate is moved past the laser beam.

12. The process of claim 3 wherein the power density is supplied by first and second laser(s) for providing first and second beam(s) of laser energy intersecting over the substrate.

13. The process of claim 1 in which the laser energy is split into two paths which intersect adjacent the substrate.

14. The process of claim 1 wherein the substrate comprises glass tubing, and the reactants are $SiH_4$ and $TiCl_4$ and oxygen which forms a first film of silica doped with titanium on said tubing.

15. The process of claim 14 wherein after the first film is formed to a suitable thickness, a second film is formed over said first film.

16. A process for forming solid film(s) on a substrate surface from gaseous reactant(s) in a chamber comprising:
  a. locating a substrate in a chamber;
  b. aligning a laser external to said chamber for producing a beam of laser energy proximally adjacent to the surface of the substrate upon which the solid film is to be formed;
  c. introducing said reactant(s) into said chamber;
  d. establishing a gas pressure within said chamber;
  e. with said beam of laser energy, producing a substantially thermal, non-multiphoton, unimolecular or bi-molecular reaction of said reactant(s) to form a heterogeneous nucleation of reactant product(s) on said substrate, said nucleated reactant product(s) forming said solid film.

17. The process of claim 16 wherein the laser energy has a power density in the order of 1000 Watts per $cm^2$ or less and the gas pressure is in the order of 0.01 atmospheres or higher.

18. The process of claim 16 or 17 wherein the reactant(s) are selected from the class consisting of: $SiH_4$, $NH_3$, $SiH_2Cl_2$, $SiCl_4$, $SiF_4$, $B_2H_6$, $BCl_3$, and $PH_3$.

19. A laser powered chemical vapor deposition apparatus comprising:
  a. a pair of lasers for providing intersecting laser beams of high energy electromagnetic radiation the frequency of said radiation being different for each beam;
  b. a reaction chamber having means for introducing one or more reactant gases and removing said reactant gases, means on said reactant chamber for passing said laser beams through the reactant gas, a substrate in said chamber closely spaced along the path of said laser beams whereby a reaction zone is achieved directly adjacent to said substrate and near the intersection of the two laser beams and in which heterogeneous nucleation of the reactant gas occurs at a predetermined temperature and laser density level thereby to form a film of high purity on said substrate without substantially heating said substrate.

* * * * *